(12) United States Patent
Ogawa et al.

(10) Patent No.: US 9,159,528 B2
(45) Date of Patent: Oct. 13, 2015

(54) ELECTRON BEAM APPARATUS

(71) Applicant: SAMSUNG ELECTRONICS CO., LTD., Suwon-si, Gyeonggi-do (KR)

(72) Inventors: Takashi Ogawa, Kanagawa (JP); Yasutsugu Usami, Kanagawa (JP); Mitsuhiro Togashi, Kanagawa (JP)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/294,639

(22) Filed: Jun. 3, 2014

(65) Prior Publication Data
US 2014/0361168 A1    Dec. 11, 2014

(30) Foreign Application Priority Data

Jun. 7, 2013  (JP) ................................. 2013-120655
Feb. 4, 2014  (KR) ........................ 10-2014-0012678

(51) Int. Cl.
*H01J 37/26* (2006.01)
*H01J 37/12* (2006.01)
*H01J 37/244* (2006.01)
*H01J 37/28* (2006.01)

(52) U.S. Cl.
CPC ............... *H01J 37/12* (2013.01); *H01J 37/244* (2013.01); *H01J 37/28* (2013.01); *H01J 2237/24485* (2013.01); *H01J 2237/24564* (2013.01); *H01J 2237/24592* (2013.01); *H01J 2237/281* (2013.01)

(58) Field of Classification Search
USPC .................. 250/305, 306, 307, 309, 310, 311
See application file for complete search history.

(56) References Cited

U.S. PATENT DOCUMENTS

| | | | |
|---|---|---|---|
| 4,896,036 A | 1/1990 | Rose et al. | |
| 4,896,063 A | 1/1990 | Roberts | |
| 6,683,320 B2 | 1/2004 | Gerlach et al. | |
| 7,902,521 B2 | 3/2011 | Kim et al. | |
| 2008/0067381 A1* | 3/2008 | Hiroi et al. | 250/310 |
| 2013/0248731 A1* | 9/2013 | Tanimoto et al. | 250/396 R |

FOREIGN PATENT DOCUMENTS

| | | |
|---|---|---|
| JP | 10-021861 A | 1/1998 |
| JP | 2000-182558 A | 6/2000 |
| JP | 2003-332207 A | 11/2003 |
| JP | 2005-121635 A | 5/2005 |
| WO | WO 00/31769 A2 | 6/2000 |

* cited by examiner

*Primary Examiner* — Nicole Ippolito
(74) *Attorney, Agent, or Firm* — Lee & Morse, P.C.

(57) ABSTRACT

An electron beam apparatus includes at least one electron beam column. The at least one beam column includes an electron beam optical system to irradiate an electron beam on a surface of a sample, and a detection system to detect electrons generated from the electron beam. The electron beam optical system includes an object lens to focus the electron beam on a surface of the sample. The object lens includes an electrostatic lens having a first electrode to which a first voltage is applied, a second electrode that is grounded, a third electrode to which a second voltage is applied, and a fourth electrode that is grounded. The first through fourth electrodes sequentially arranged relative to the sample.

20 Claims, 13 Drawing Sheets

ELECTRON BEAM APPARATUS

CROSS-REFERENCE TO RELATED APPLICATIONS

Japanese Patent Application No. 2013-120655, filed on Jun. 7, 2013, and Korean Patent Application No. 10-2014-0012678, filed on Feb. 4, 2014, and entitled, "Electron Beam Apparatus," are incorporated by reference herein in their entireties.

BACKGROUND

1. Field

One or more embodiments herein relate to semiconductor patter inspection.

2. Description of Related Art

An electron beam apparatus may perform an inspection of the electrical characteristics, exterior appearance, and/or existence of foreign matter on a semiconductor wafer. For example, the electron beam apparatus may perform an electrical characteristic inspection (e.g., presence of opens or shorts) of a contact hole according to an electrification state. To perform such an inspection, the electron beam apparatus may include an electron beam column. However, the inspection may require a considerable amount of time to scan the entire wafer using this arrangement.

SUMMARY

In accordance with one embodiment, an electron beam apparatus includes at least one electron beam column includes: an electron beam optical system to irradiate an electron beam on a surface of a sample, and a detection system to detect electrons generated according to irradiation of the electron beam, wherein the electron beam optical system includes an object lens to focus the electron beam at a predetermined location on a surface of the sample, and wherein the object lens includes an electrostatic lens that includes a first electrode to which a negative voltage is applied, a second electrode that is grounded, a third electrode to which a focus voltage is applied, and a fourth electrode that is grounded, the first through fourth electrodes sequentially arranged relative to the sample.

Electrification on the surface of the sample, electron energy to be detected on the surface of the sample, an incident angle of the electron beam, or filtering of the electron beam may be controlled based on changes in potential difference between a voltage applied to the first electrode and a voltage applied to the sample. The focus voltage may be a positive voltage. The apparatus may include a plurality of the electron beam columns.

The detection system may include a first detector opposing the sample with respect to the object lens; a second detector above the sample and spaced farther from the sample than the first detector; and a third detector at the object lens. The third detector may be at the first electrode of the object lens. The third detector may be at the second electrode of the object lens, and the first electrode may include an opening exposing the third detector.

In accordance with another embodiment, an electron beam apparatus includes an electron beam column, which includes an electron beam optical system to irradiate an electron beam on a surface of a sample, and a detection system to detect electrons generated based on irradiation of the electron beam, wherein the electron beam optical system includes an object lens to focus the electron beam at a predetermined location on a surface of the sample, wherein the detection system includes a first detector and a second detector, and wherein the object lens is between the first detector and the sample and the first detector is between the object lens and the second detector.

An inner diameter of the second detector may be less than an inner diameter of the first detector. The apparatus may include a third detector at the object lens. At least one of the first through third detectors may include a plurality of detecting units.

The object lens may be an electrostatic lens which includes a first electrode to receive a negative voltage, a second electrode that is grounded, a third electrode to receive a focus voltage, and a fourth electrode that is grounded, and wherein the first electrode, second electrode, third electrode, and fourth electrode are sequentially arranged relative to the sample.

The electron beam column may include a deflection unit between the first and second detectors to deflect the electron beam. The deflection unit may include an ExB deflector which includes an electric field that orthogonally crosses a magnetic field. The deflection unit may include a magnetic-field type alignment device and a scanning electrode disposed above the magnetic field type alignment device.

In accordance with another embodiment, an electron beam column includes an object lens to focus an electron beam on a surface of a sample, and at least one detector to detect electrons based on the electron beam, wherein the object lens includes an electrostatic lens that includes a first electrode to which a first voltage is applied, a second electrode that is grounded, a third electrode to which a second voltage is applied, and a fourth electrode that is grounded, and wherein are sequentially arranged relative to the sample. The first voltage may be one of a negative voltage or positive voltage, and the second voltage is may be other one of the negative voltage or positive voltage.

The at least one detector may include a plurality of detectors aligned along a common axis passing through the object lens. The plurality of detectors may include a first detector spaced a first distance from the sample; a second detector spaced a second distance from the sample; and a third detector spaced a third distance from the sample. The second distance may be greater than the first distance, and the third distance may be less than the first and second distances.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
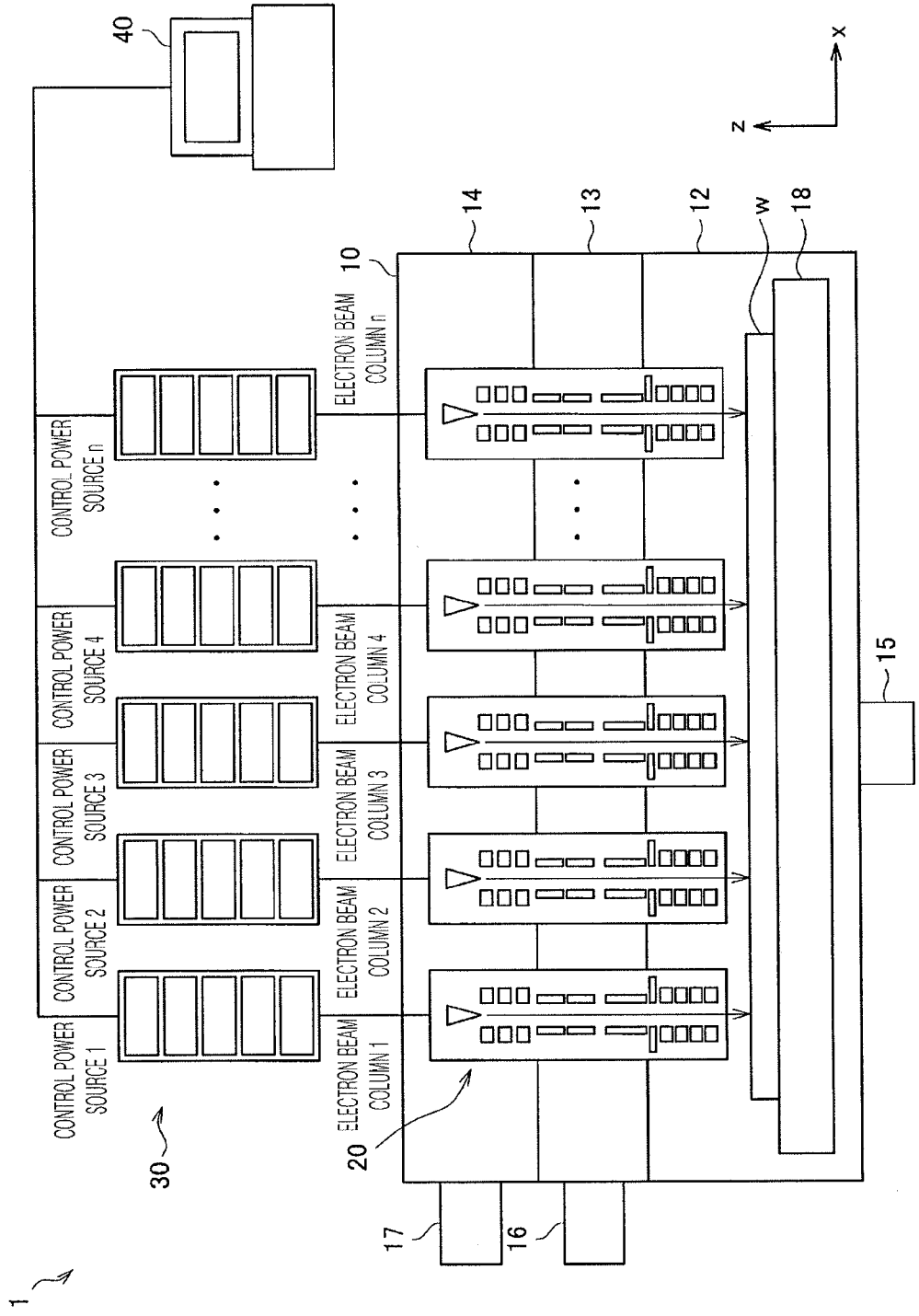
FIG. 1 illustrates an embodiment of an electron beam apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of an electron beam apparatus 1 for inspecting, for example, a semiconductor circuit pattern of a semiconductor wafer W. The electron beam apparatus 1 may include a chamber unit 10, a plurality of electron beam columns 20, a control power source 30, and a control device 40.

The chamber unit 10 may emit electron beams to a surface of the wafer W using the electron beam columns 20 for inspection. The chamber unit 10 may include a first chamber (sample vacuum chamber) 12 where wafer W is accommodated, a second chamber (intermediate vacuum chamber) 13 that is an intermediate chamber, and a third chamber (electron gun vacuum chamber) 14 where an electron gun is disposed.

A stage 18 for placing the wafer W may be disposed in first chamber 12. The stage 18 may be configured to support a surface that is an inspection target and a rear surface of the wafer W through a sample accommodating surface. The stage 18 may move the wafer W in an arbitrary direction within a parallel plane as the surface. During an inspection operation, stage 18 may be moved by a driving device, to thereby move wafer W in a predetermined direction at a predetermined speed.

The first through third chambers 12 through 14 may be independent from each other and set at different vacuum levels. The first through third chambers 12 through 14 may be respectively connected to vacuum pumps 15 through 17 for setting a predetermined vacuum level.

The electron beam column 20 may irradiate an electron beam (e.g., primary electron beam) obtained by gathering and accelerating electrons in a spot shape onto wafer W on stage 18. The electron beam may be irradiated by an optical system, while detecting an electron beam (e.g., secondary electron beam) using a detection system.

In the current embodiment, electron beam apparatus 1 may include the plurality of electron beam columns 20, with each electron beam column 20 connected to division plates at boundaries of the first through third chambers 12 through 14. Each electron beam column 20 may include an orifice at a center portion, through which a portion of the beam passes. In the current embodiment, electron beam columns 20 may have the same structure. In other embodiments, their structures may be different.

The control power source 30 may transmit a scan voltage to each electron beam column 20. The control power source 30 may be disposed where, for example, one control power source 30 is assigned to one electron beam column 20. The control power source 30 may output a signal of a high voltage current or a high-frequency current. Each control power source 30 may include a compensation unit to compensate for phase misalignment of a signal (e.g., a high frequency voltage) output by control power source 30, to compensate for standby time of a scan signal, and/or to convert a control current for a filter.

The control device 40 may transmit a control command to each electron beam column 20, or may form an image of a wire pattern based on a secondary electron beam (e.g., signal electron beam). The signal electron beam may be an output signal reflecting a shape of a wire pattern obtained by irradiating an electron beam to the wafer W.

A scanning electron microscope (SEM) image of the wafer W may be obtained through the control device 40. The control device 40 compares images of a plurality of wire patterns to detect an abnormality in the wire patterns. The abnormality may be detected by control device 40 or by an operator looking at the images from control device 40. The control device 40 may include an information processing apparatus, such as a computer including a central processing unit (CPU) or a graphics processing unit (GPU).

The electron beam apparatus 1 may include the plurality of electron beam columns 20 to improve a defect detecting efficiency. For example, the electron beam apparatus 1 may include a column in which electron beam columns 20 are arranged in a row, or may include a plurality of columns arranged perpendicular to an arrangement direction of the column. The electron beam apparatus 1 may include more electron beam columns 20 by arranging the electron beam columns 20 in a zigzag or other type of staggered pattern.

Figure 2:
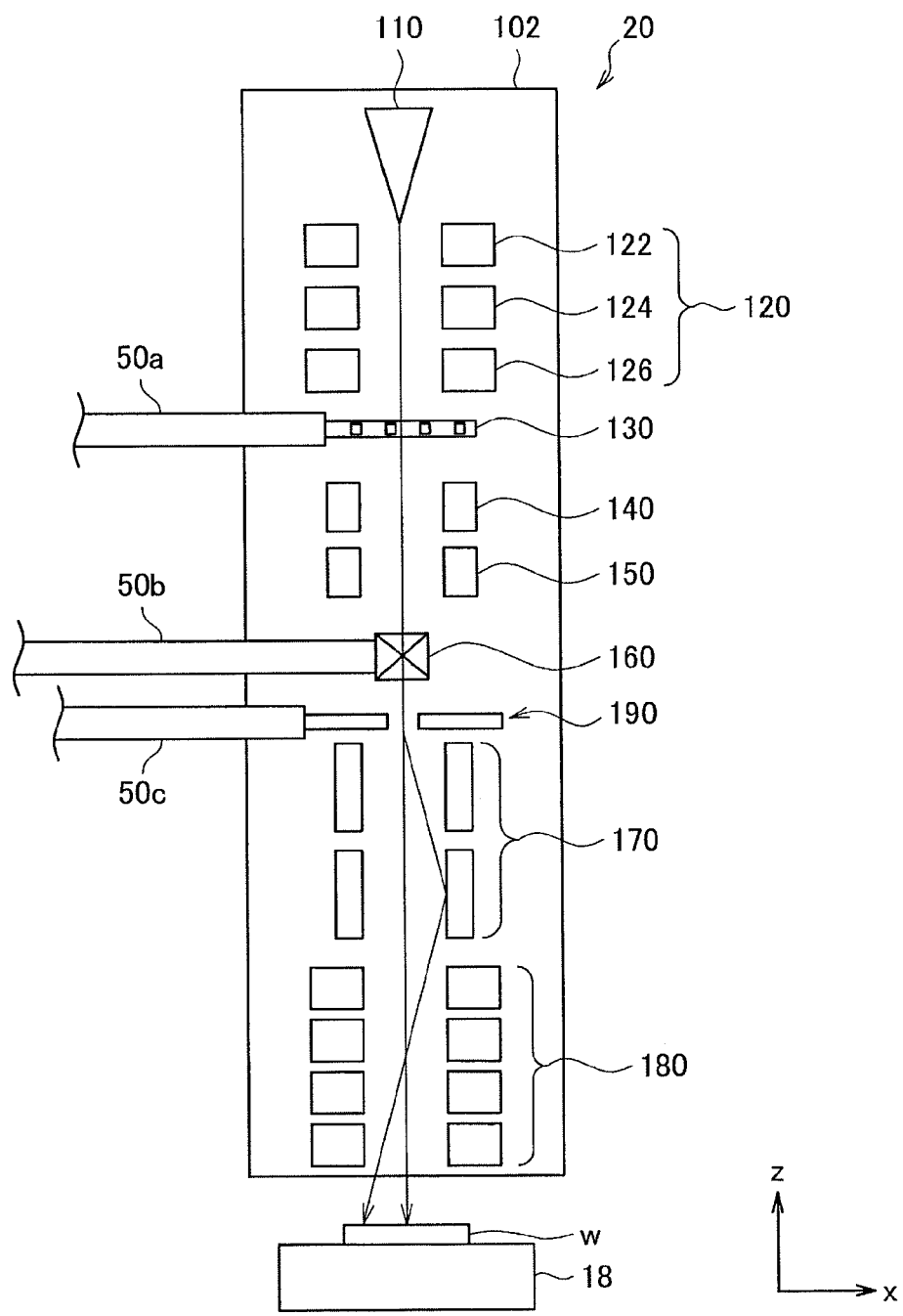
FIG. 2 illustrates an embodiment of an electron beam column.

FIG. 2 illustrates an embodiment of electron beam column 20. In FIG. 2, an electrostatic lens and a regulating system are shown, but alternatively, a lens using a magnetic field and a regulating system may be included. In order to quickly perform an inspection, a scanning electrode for scanning an electron beam may be electrostatic.

The electron beam column 20 may include various components used for SEM in a housing 102. For example, electron beam column 20 may include an electron gun 110, a condenser lens system 120, a beam iris unit 130, an optical axis adjusting unit 140, a blanking electrode 150, a division valve 160, a scanning electrode 170, an object lens 180, and an electron detector 190. In electron beam apparatus 1, electron detector 190 may form a detection system. Electron beam optical components excluding the detection system may form an electron beam optical system.

The electron gun 110 is an apparatus for emitting an electron beam. The electron gun 110 may be a Schottky-type or thermal-field-discharge-type electron gun. The electron gun 110 may emit an electron beam based on an applied acceleration voltage. The emitted electron beam may be concentrated by beam iris unit 130 or condenser lens system 120, the latter of which may include condensers 122, 124, and 126 arranged in a heading direction of the electron beam. The electron gun 110 may be adjusted to have a desired current.

The optical axis adjusting unit 140 may compensate for astigmatism of the electron beam, adjust a location of the electron beam on an optical axis, and adjust an irradiation location of the electron beam on the sample (e.g., wafer W). Also, the blanking electrode 150 may temporarily block the electron beam, such that the electron beam is not irradiated on wafer W on stage 18. The blanking electrode 150 may bend the electron beam emitted from the electron gun 110, such that the electron beam is not irradiated on wafer W.

The division valve 160 may divide an electron gun chamber, an intermediate chamber, and a sample chamber in the electron beam column 20. For example, the division valve 160 may be used to divide each chamber, such that the electron gun chamber or intermediate chamber is not opened to the air when the sample chamber malfunctions. Generally, division valve 160 may be opened. According to one embodiment, division valve 160 may not be included in electron beam column 20.

The scanning electrode 170 may deflect the electron beam according to a high-frequency control signal (e.g., electric signal) applied from outside electron beam column 20. A high-frequency current corresponding from 0 to 400 V may be applied to scanning electrode 170. By applying a predetermined control signal to scanning electrode 170 to deflect the electron beam, the electron beam may be irradiated in a predetermined direction on the surface of wafer W.

The object lens 180 may be disposed at a tip portion of electron beam column 20, and may face wafer W on stage 18. The object lens 180 may focus the electron beam deflected by scanning electrode 170 on the surface of wafer W. In the current embodiment, object lens 180 is an electrostatic lens and includes four electrodes.

The electron detector 190 is included in the detection system for outputting a high-frequency detection signal (e.g., signal electron beam) by detecting secondary electrons and reflection electrons emitted according to a circuit pattern, as the electron beam is irradiated on wafer W. The electron detector 190 may include first through third detectors 192, 194, and 196. The detection signal detected by electron detector 190 may be transmitted outside the electron beam column 20 via a transmitting unit. The detection signal may be amplified by a preamplifier and then converted to digital image data of a circuit pattern by an analog-to-digital (AD) converter. The control device 40 may output the digital image data.

According to such a structure of electron beam column 20, the surface of wafer W may be scanned by the electron beam emitted from electron gun 110. The secondary electron beam, including secondary electrons or reflection electrons to which a shape, composition, and/or electrification state of the circuit pattern are applied, may be detected by electron detector 190. A detection signal of the detected secondary electron beam may be processed by control device 40 through a preamplifier or AD converter, or may be used to detect a defect based on the image of the circuit pattern of wafer W.

Transmitting units 50a, 50b, and 50c may be mounted on electron beam column 20 for transmitting information between outside and inside of electron beam column 20. The transmitting units 50a, 50b, and 50c may be electrical transmitting units for transmitting an external electric signal to members involved in electrical operations. The transmitting units may also externally transmit an electric signal generated in the members accompanying electrical operations. Alternatively, the transmitting units 50a, 50b, and 50c may be optical transmitting units for externally transmitting and receiving light (such as a light guide), or mechanical transmitting units performing mechanical operations.

Figure 3:
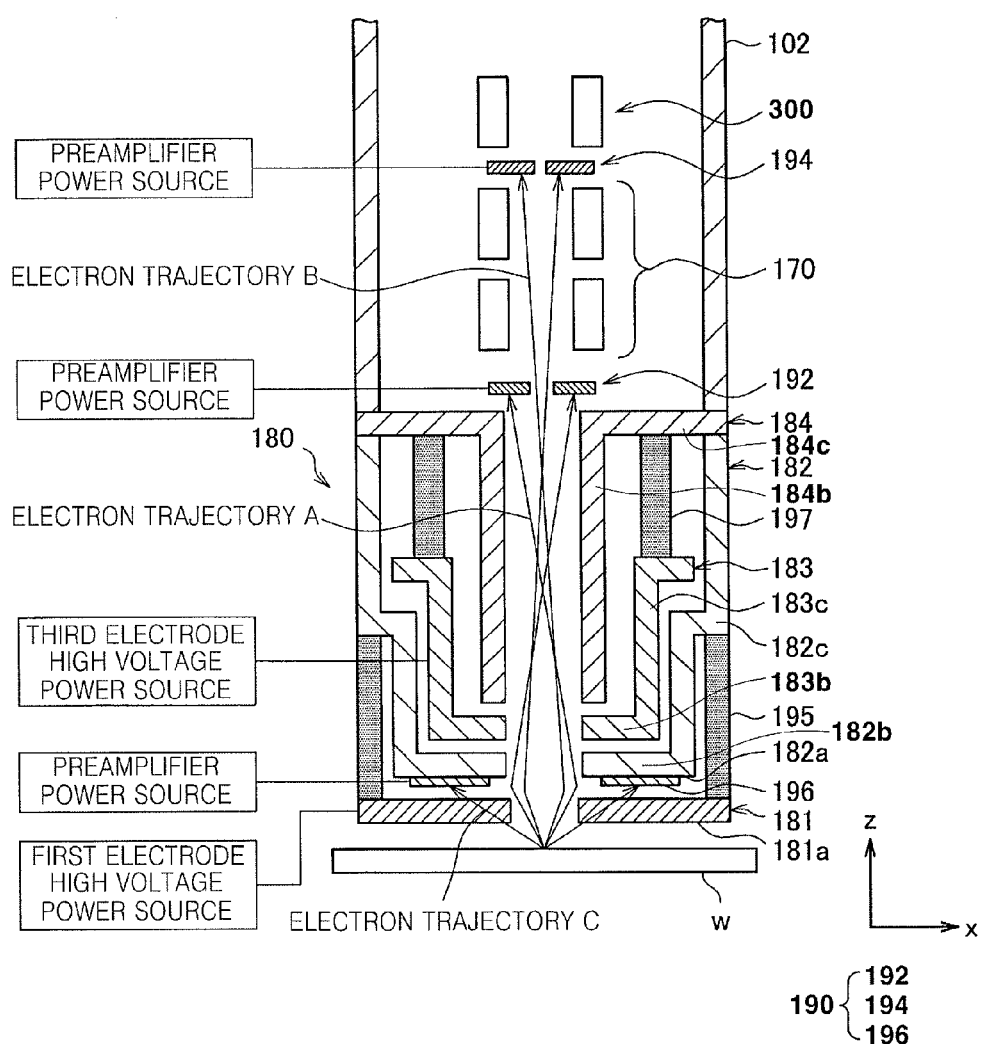
FIG. 3 illustrates an embodiment of an object lens and electron detector in the electron beam column.

FIG. 3 illustrates object lens 180 and electron detector 190 of the electron beam column 20 according to one embodiment.

The object lens 180 may be a tube-shaped structure having an opening at a center for the electron beam to pass through. The object lens 180 may include four electrodes (i.e., first electrode 181, second electrode 182, third electrode 183, and fourth electrode 184). The first through fourth electrodes 181 through 184 may be disposed in the stated order from a side of object lens 180 facing wafer W on stage 18.

The first electrode 181 may be connected to a support 182c of the second electrode 182 extending from housing 102 of electron beam column 20, through an insulator 195. The first electrode 181 is an annular member having an outer circumference that almost has the same diameter as an outer circumference of the housing 102. The first electrode 181 may have an opening at the center for the electron beam to pass through. A first surface (outer surface) 181a of the first electrode 181 faces wafer W on stage 18.

The second electrode 182 may include an electrode portion 182b having an annular shape. The second electrode 182 may have a support 182c to which insulator 195 supporting electrode portion 182b and first electrode 181 is connected. The support 182c may include a large diameter portion having almost the same diameter as the housing 102, and a small diameter portion having a smaller diameter than the large diameter portion. The large diameter portion may be connected to housing 102. The small diameter portion may extend from the large diameter portion to first electrode 181. An outer circumference portion of electrode portion 182b may be fixed to a tip of the small diameter portion. The electrode portion 182b may be disposed between the first and third electrodes 181 and 183. The third detector 196 may be disposed at a first surface (surface facing the first electrode 181) 182a of the electrode portion 182b of the second electrode 182.

The third electrode 183 may include an electrode portion 183b having an annular shape, and a support 183c having a tube shape supporting electrode portion 183b. The support 183c may include a flange portion and a tube portion. The flange portion is connected to the fourth electrode 184 through an insulator 197. The tube portion extends from the flange portion to first electrode 181. The tube portion has a smaller diameter than the small diameter portion of second electrode 182. An outer circumference portion of electrode portion 183b may be fixed to a tip of the tube portion. The electrode portion 183b may be disposed between second electrode 182 and fourth electrode 184.

The fourth electrode 184 may include a flange portion 184c connected to the housing 102, and an electrode portion 184b having a tube shape extending from the flange portion 184c to first electrode 181. The flange portion 184c may support the third electrode 183 through the insulator 197 while an inner circumference portion of the flange portion 184c may support an end of the electrode portion 184b. By using electrode portion 184b, an insulator for applying a high voltage to the third electrode 183 may not be exposed to the electron beam. An inner diameter of the electrode portion 184b of the fourth electrode 184 may be almost the same as an inner diameter of an opening of each electrode portion of first through third electrodes 181 through 183.

A negative voltage may be applied to first electrode 181, and second electrode 182 may be grounded. Also, third electrode 183 may be a focus electrode, and a positive voltage may be applied thereto. As a positive voltage is applied to the third electrode 183, object lens 180 may be used as an acceleration lens. Accordingly, object lens 180 may have a lower aberration than when a negative voltage is applied to third electrode 183. At the same time, light may be concentrated by pulling up and changing a trajectory of the emitted secondary electrons. The fourth electrode 184 may be grounded. A negative voltage may be applied to wafer W on stage 18.

In the electron beam apparatus 1 according to the current embodiment, an electrification on the surface of wafer W, electron energy detectable on the surface of wafer W, or an incident angle of the electron beam with respect to the electron detector 190 may be changed by changing the potential difference between the first voltage applied to first electrode 181 of object lens 180 and the sample voltage applied to wafer W on stage 18. For example, when the first voltage is lower than the sample voltage, electrons having low energy may return to wafer W and thus electrification may be suppressed or neutralized. On the other hand, when the first voltage is higher than the sample voltage, secondary electrons may be lifted and wafer W may be positively electrified.

Also, the electron beam may be filtered by changing the potential difference between the first voltage and sample voltage with respect to the detection system. For example, when the first voltage is lower than the sample voltage, object lens 180 may be used as a high-pass filter through which only high energy electrons pass.

Figure 4:
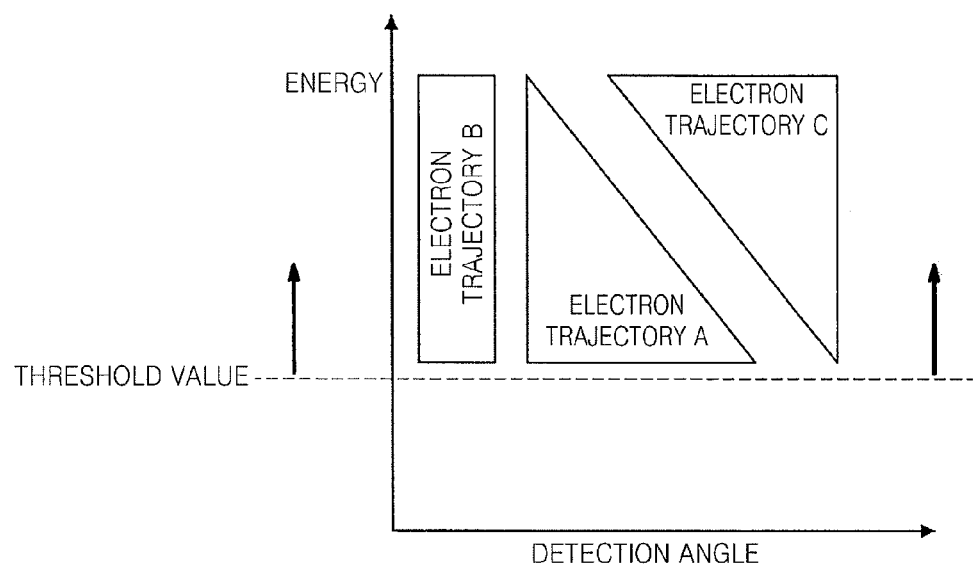
FIG. 4 illustrates a relationship between a detection angle and energy of an electron beam detectable by the electron detector when the object lens is used as a high-pass filter.

FIG. 4 is a graph showing a relationship between a detection angle and energy of an electron beam detectable by electron detector 190, when object lens 180 is used as a high-pass filter according to one embodiment. Referring to FIG. 4, it is determined that only electrons having energy equal to or higher than a predetermined threshold voltage are detected. On the other hand, when the first voltage is higher than the sample voltage, object lens 180 may be used to lift and concentrate the secondary electrons.

According to one embodiment, the potential difference between the first voltage and sample voltage may be lower than or equal to 2 kV. When the potential difference is higher than 2 kV, the secondary electron beam may move straight and escape from a central opening of electron detector 190. When the potential difference is lower than or equal to 2 kV, the secondary electron beam may expand. As a result, electrons may be easily detected compared to an annular detector having an opening at a center for a primary beam.

As such, electron beam apparatus 1 may reduce an amount of change of the focus voltage of the third electrode 183, even when the potential difference between the first voltage and sample voltage is continuously changed using the four electrodes as described above.

Figure 14:
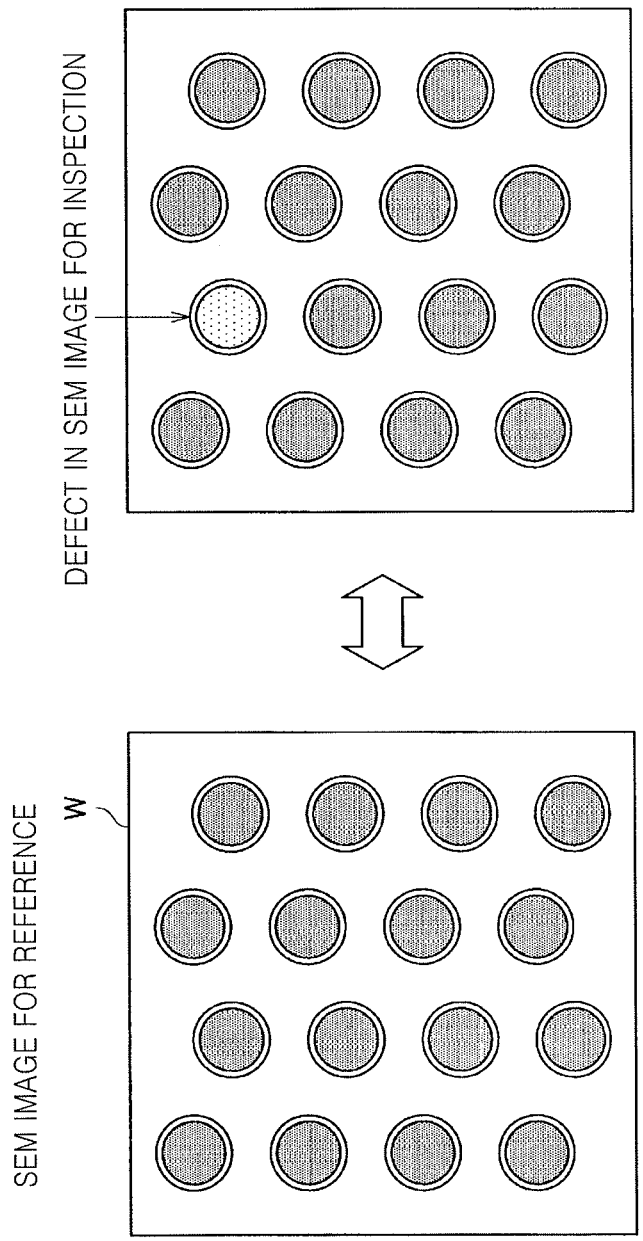
FIG. 14 illustrates an embodiment of a method for detecting a defect using an electron beam.

When defect of wafer W is to be detected using electron beam apparatus 1, it may be difficult to clearly compare an SEM image at a reference location and an SEM image at an inspection location. Accordingly, as shown in FIG. 14, the potential difference may be adjusted to change an electrification of the sample (W), thereby adjusting an object image. Also, in electron beam apparatus 1, a desired image is obtained by adjusting object lens 180, to thereby improve detecting performance of a defect, improve an inspection precision, and enable effective inspection by continuously adjusting object lens 180.

A change of the focus voltage by object lens 180 of the electron beam apparatus 1 according to another embodiment will now be described with using three electrodes. When three electrodes are used, it is assumed that second electrode 182 is omitted from among the first through fourth electrodes 181 through 184 in object lens 180.

Here, a standard condition is that the potential difference between the first voltage and the sample voltage is 0 V. For example, when acceleration energy of the electron beam is 8 keV and incident energy of the electron beam on the sample is 1 keV, the sample voltage is −7 kV and the first voltage is −7 kV.

Then, it may be assumed that the first voltage is changed to −6.9 kV from the standard condition. Here, the potential difference is +0.1 kV, and a voltage required to focus a primary electron beam on the sample is observed to be +14.4 kV. Also, the focus voltage of the standard condition is observed to be +14.1 kV. Accordingly, the amount of change of the focus voltage, which is a difference from the focus voltage +14.1 kV in the standard condition, is 0.3 kV. Also, a relative amount of change of the focus voltage with respect to the focus voltage in the standard condition is 2.1% (0.3/14.1%).

Similarly, when three electrodes are used, the voltage required to focus the primary electron beam on the sample is observed to be +12.7 kV, when the first voltage is changed to −6.9 kV from the standard condition. Also, the focus voltage in the standard condition is observed to be +11.8 kV. Accordingly, the amount of change of the focus voltage, which is the difference from the focus voltage +11.8 kV in the standard condition, is 0.9 kV. Also, a relative amount of change of the focus voltage with respect to the focus condition in the standard condition is 7.6% (0.9/11.8%).

Accordingly, by forming an object lens with four electrodes, an amount of change of a focus voltage may be improved by about 72% compared to when three electrodes are used.

Figure 15:
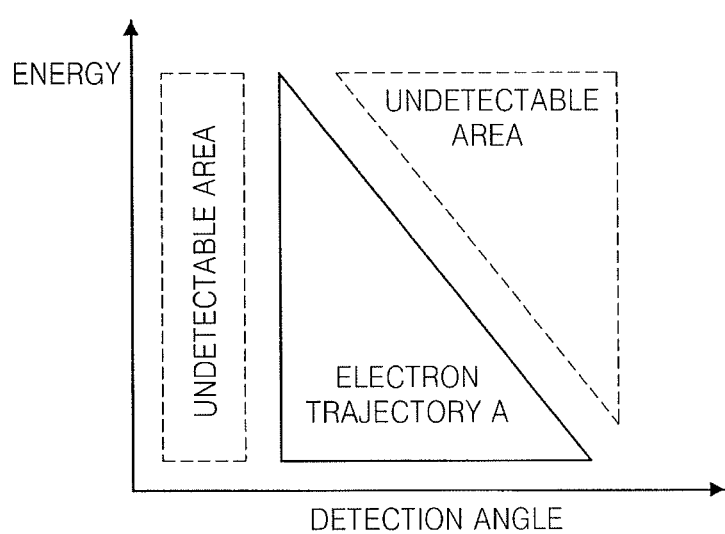
FIG. 15 illustrates a relationship between a detection angle and energy of an electron beam detectable by a general detector.

According to one embodiment, the electron beam column 20 includes three detectors (first through third detectors 192 through 196) as electron detector 190 for detecting an electron beam. When one detector is disposed in the electron beam column 20, there may be an electron beam undetectable by the detector, as shown in FIG. 15. Thus, electron beam column 20 includes a plurality of detectors, for example, first through third detectors 192 through 196 to detect the electron beam that is undetectable by one detector.

The first detector 192 may be disposed above object lens 180 (a direction opposite to stage 18), as shown in FIG. 3. The first detector 192 is an annular electron detecting sensor, and an electron detecting area thereof may be smaller than the inner diameter of the fourth electrode 184. The first detector 192 may be disposed as close as possible to object lens 180. Because electron beam apparatus 1 includes a plurality of electron beam columns 20, an area or width of each detector may be limited. Thus, by disposing a detector close to object lens 180 that is close to the sample, emitted electrons may be detected in a wide range.

The second detector 194 is an annular electron detecting sensor, and may be disposed higher than the first detector 192. For example, as shown in FIG. 3, second detector 194 may be disposed between alignment device 300 and scanning electrode 170. The second detector 194 may detect a small angle component of electrons that are discharged through the opening at the center of first detector 192. An inner diameter of the opening of second detector 194 may be smaller than an inner diameter of the opening of first detector 192. The first and second detectors 192 and 194 detect electrons at a high efficiency.

Figure 5:
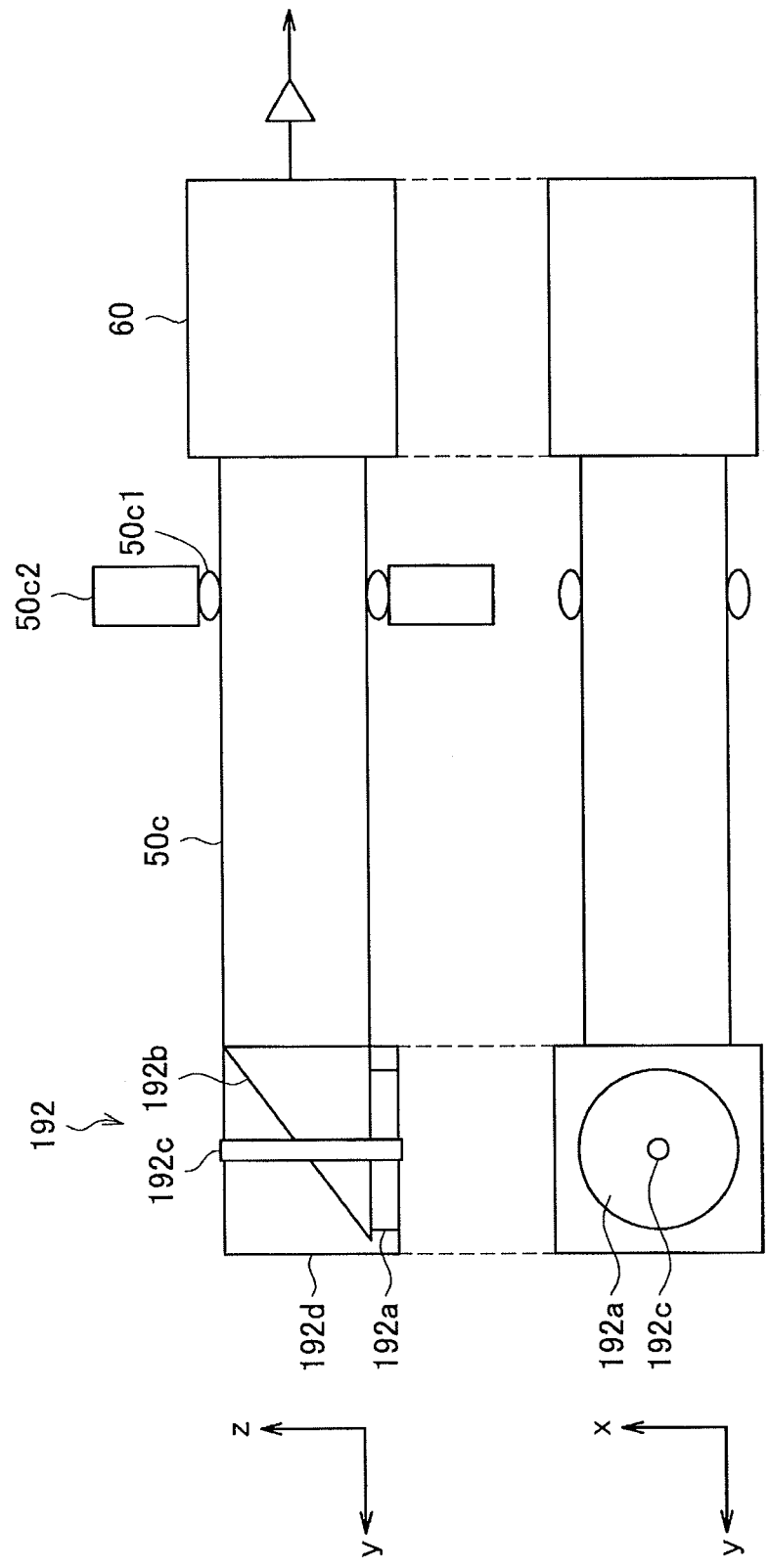
FIG. 5 illustrates an embodiment of an electron detector using a scintillator.

The first and second detectors 192 and 194 may include, for example, a semiconductor detector or a scintillator. When first or second detector 192 or 194 includes a scintillator, the first or second detector 192 or 194 may be configured as shown in FIG. 5. In FIG. 5, the first detector 192 includes a scintillator 192a, and the second detector 194 may be identically configured.

Referring to FIG. 5, the scintillator 192a is a material that emits fluorescent light according to incidence of radiation, and may convert incident electrons to light. The light obtained by converting electrons by the scintillator 192a may be reflected at a mirror surface 192b and induced to transmitting unit 50c, which serves as a light guide. One end of transmitting unit 50c may be connected to a photomultiplier tube 60. The light may be converted to electrons and amplified by the photomultiplier tube 60. An amplified electron signal obtained as such may be detected by the detection system (e.g., a detection circuit system).

A center of scintillator 192a has an opening, and a metal tube 192c may pass through the opening. A primary electron beam may pass through metal tube 192c. A tip of scintillator 192a may be covered by metal tube 192c and a metal cover 192d. The scintillator 192a may be configured so as not to expose an insulator to an electron beam. The first detector 192 may be divided, for example, by a flange 50c2. The transmitting unit 50c may be divided by an O-ring 50c1. Accordingly, a vacuum portion in the electron beam column 20 and an atmosphere portion outside the electron beam column 20 may be divided.

Also, in order to induce fluorescent light emitted by scintillator 192a to the transmitting unit 50c, a metal, such as aluminum (Al), may be deposited on the mirror surface 192b. Also, transmitting unit 50c may be supported at a small contact area in order to reduce light leakage. For example, transmitting unit 50c may be supported only at the O-ring 50c1.

Figure 6:
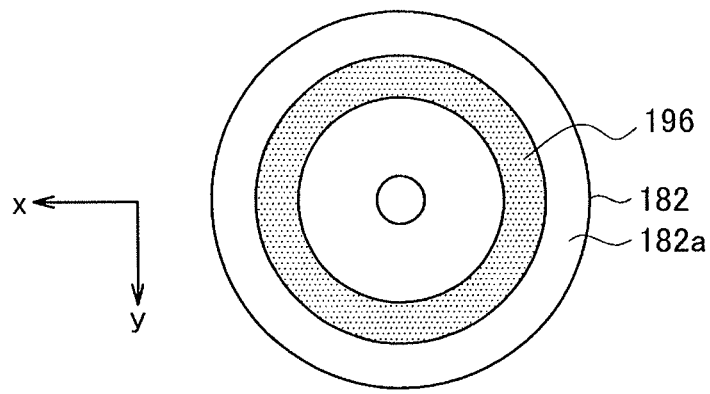
FIG. 6 illustrates an embodiment of a third detector at a second electrode.

Referring back to FIG. 3, third detector 196 is an annular electron detecting sensor disposed at the first surface 182a of second electrode 182 of object lens 180 shown in FIG. 6. The third detector 196 may be, for example, a semiconductor detector due to a spatial limitation at the tip of object lens 180.

Figure 7:
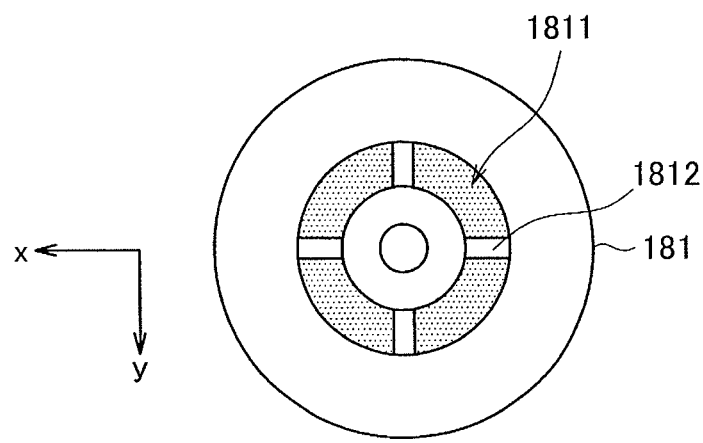
FIG. 7 illustrates an embodiment of a first electrode.

An opening 1811 through which an electron beam passes from wafer W may be formed at the first electrode 181 of object lens 180. As shown in FIG. 7, according to an embodiment, four openings 1811 may be formed along a circumferential direction of the first electrode 181 at regular intervals in almost the same size. For example, each opening 1811 may be formed by cutting first electrode 181. Also, an electric potential of opening 1811 may be uniform, by providing a grid 1812 extending between the openings 1811 in a diameter direction. In the current embodiment, the number of openings 1811 is four, but the number of openings 1811 may be one or more in other embodiments for an electron beam to pass through.

The first through third detectors 192 through 196 may be provided in the electron beam column 20 according to a trajectory of an electron beam, as shown in FIG. 3. In other words, a secondary electron beam may spread and proceed with respect to an incident direction of an electron beam. The incident direction may be perpendicular to a sample accommodating surface of stage 18. Thus, in electron beam column 20, the first through third detectors 192 through 196 may detect electrons according to an angle (e.g., a detection angle) formed by a heading direction of a secondary electron beam with respect to an incident direction of an electron beam. By disposing the first through third detectors 191 through 196 to respective secondary electron beams having different detection angles in order to obtain an image, a signal corresponding to a certain defect may be strengthened. For example, the second detector 194 which selectively detects electrons of a small detection angle may be used in detecting a defect at bottom of hole on wafer W.

Figure 8:
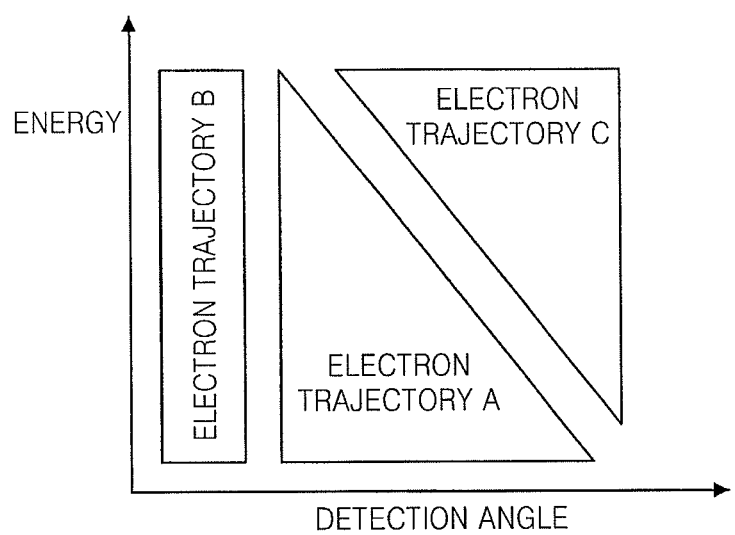
FIG. 8 illustrates a relationship between a detection angle and energy of an electron beam detectable by the electron detector of FIG. 3.

FIG. 8 is a graph showing a relationship between a detection angle and energy of an electron beam detectable by each of the first through third detectors 192 through 96, according to one. In FIG. 8, an electron beam of an electron trajectory A may be detected by first detector 192, an electron beam of an electron trajectory B may be detected by second detector 194, and an electron beam of an electron trajectory C may be detected by third detector 196.

As shown in FIG. 8, the third detector 196 may detect electrons emitted in high energy at a large detection angle. For example, third detector 196 may detect a minute unevenness of a sample. According to one embodiment, third detector 196 may be disposed at second electrode 182 of object lens 180. In other words, a level of a signal line may be an electric potential base. Accordingly, wires may be easily insulated. Also, because the detection system (or a detection circuit system) of a preamplifier at the back is an electric potential base, electron beam apparatus 1 may quickly operate.

The following Examples and Comparative Examples are provided to highlight characteristics of one or more embodiments described herein. However, it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

For at least one of the examples, object lens 180 and electron detector 190 of the electron beam column 20 may be configured differently from FIG. 3.

Example 1

Figure 9:
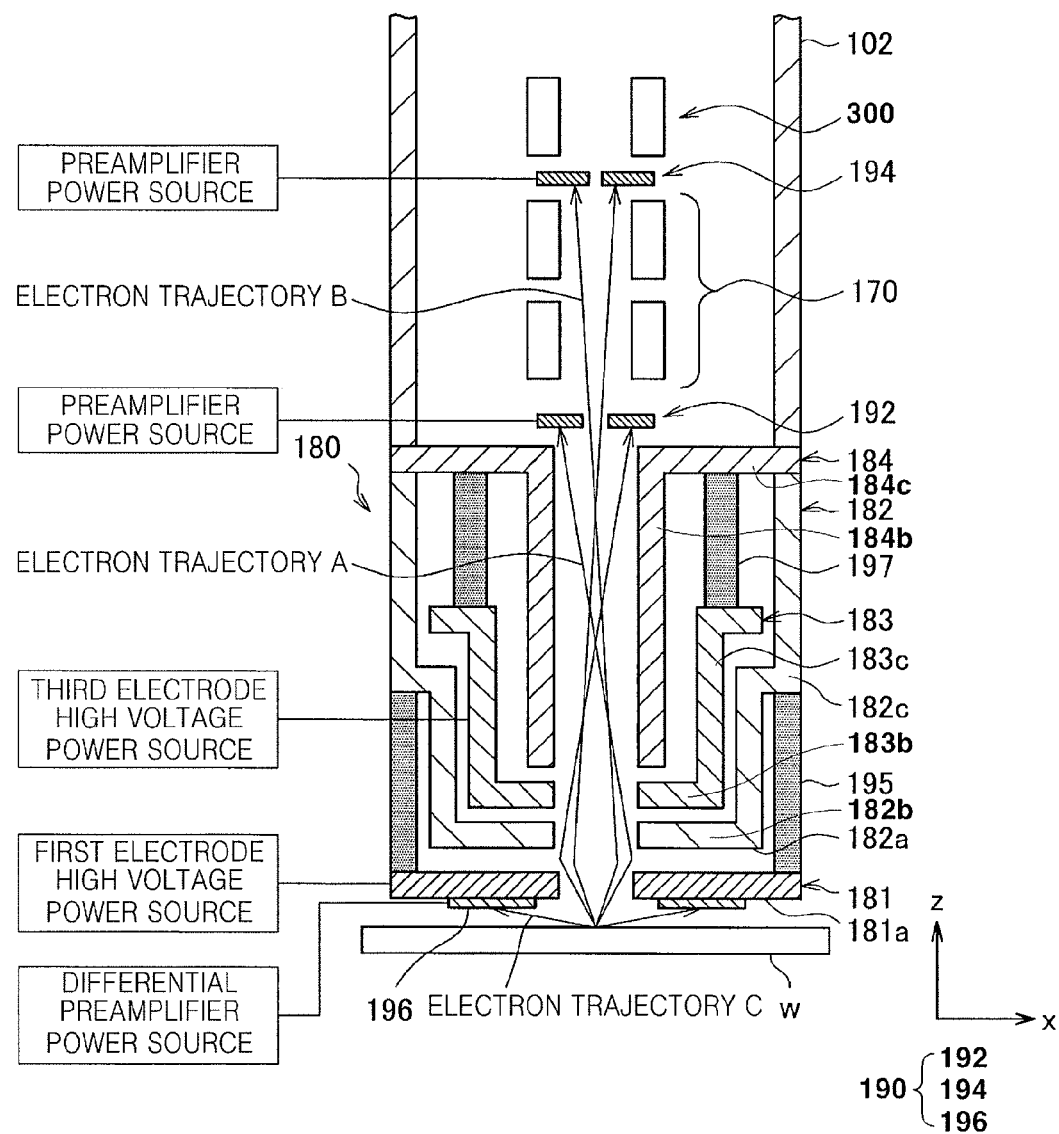
FIG. 9 illustrates an embodiment which includes object lens and electron detector, with a third detector disposed at a first electrode.
Figure 10:
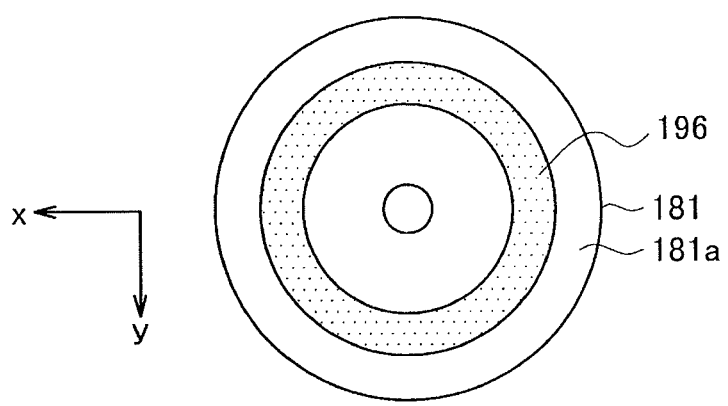
FIG. 10 illustrates an embodiment which includes a third detector at a first electrode.

As shown in FIGS. 9 and 10, third detector 196 may be disposed at first electrode 181. In other words, as shown in FIGS. 9 and 10, third detector 196 is disposed on first surface 181a of first electrode 181 of object lens 180. Because third detector 196 is disclosed closer to wafer W, it is possible to detect a secondary electron beam that is emitted in a wider angle. Because an electron beam floats due to high pressure, a differential amplifier for a high voltage may be used.

Example 2

Figure 11:
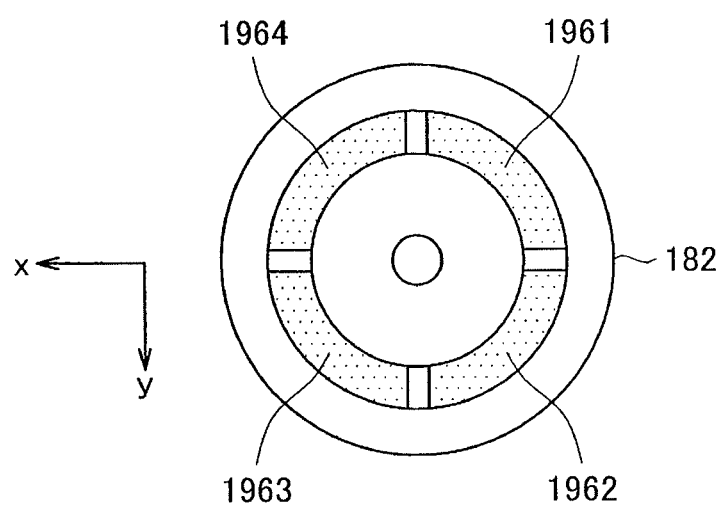
FIG. 11 illustrates an embodiment which includes a third detector at a second electrode, with a divided electron detector.

Alternatively, the first through third detectors 192 through 196 having an annular shape may be configured as split surfaces. For example, as shown in FIG. 11, the third detector 196 may include detecting units 1961 through 1964 that are obtained by splitting the third detector 196 by four in a circumferential direction. Here, the sizes of the detecting units 1961 through 1964 may be the same. Thus, the detecting units 1961 through 1964 may respectively detect electrons emitted in corresponding orientations, and an image in which unevenness is emphasized may be obtained by calculating differences between values detected by the detecting units 1961 through 1964. In detail, according to an embodiment, when the object lens 180 is an electrostatic lens, the third detector 196 may be further effectively used since no rotation and directivity is maintained.

Example 3

Figure 12:
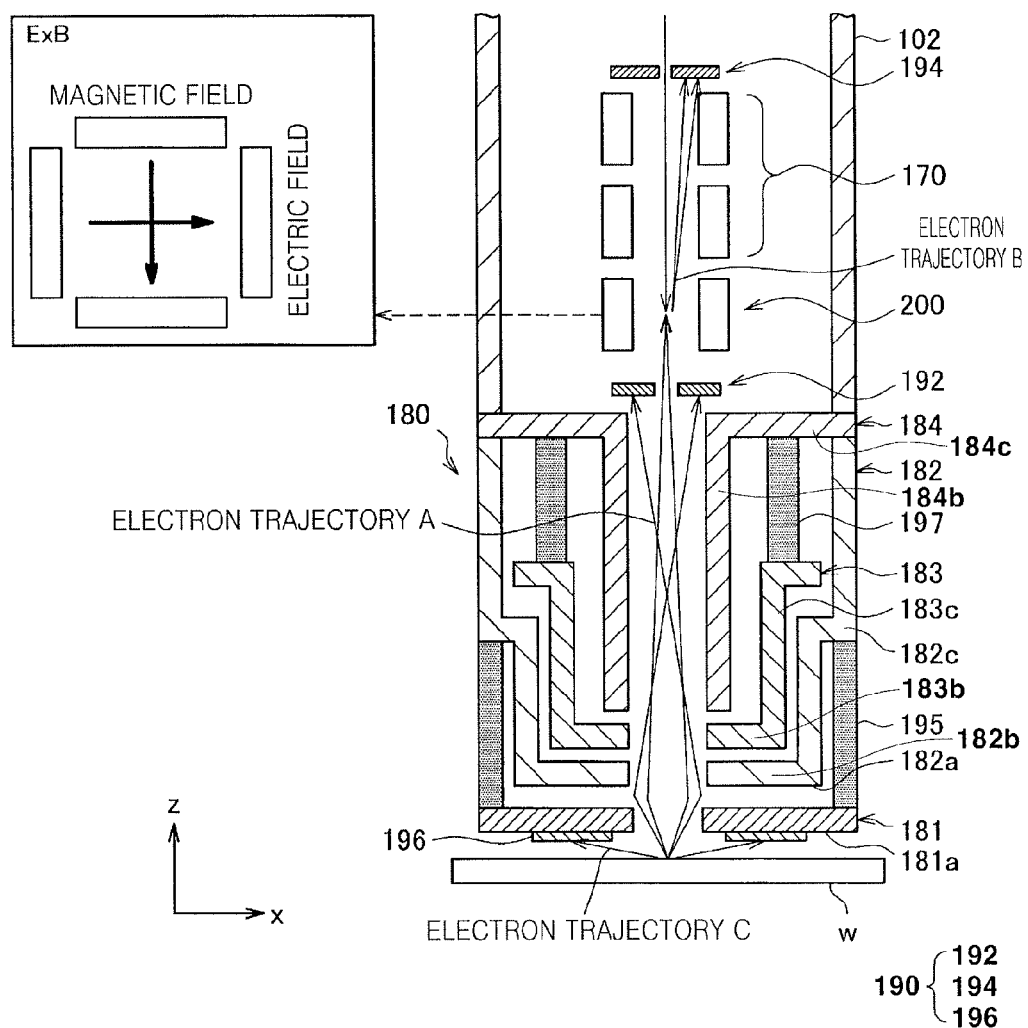
FIG. 12 illustrates an embodiment of an electron beam column with an ExB deflector.

In order to improve detecting efficiency of second detector 194, an ExB deflector 200 (in which an electric field and a magnetic field are orthogonal) may be disposed above object lens 180 and first detector 192 of electron beam column 20. The ExB defector 200 may serve as a deflection unit for deflecting an electron beam, as shown in FIG. 12. Although power sources applying voltages to object lens 180 and electron detector 190 are not shown in FIG. 12, the same voltages as described above with reference to FIG. 3 may be applied thereto.

As shown in FIG. 12, scanning electrode 170 and second detector 194 may be disposed above ExB deflector 200. The electron beam column 20 may be set in a wien condition, wherein a primary electron beam is not deflected by the ExB deflector 200, i.e., emitted straight. Because a heading direction of a signal electron beam including secondary electrons and reflection electrons is opposite to that of a primary electron beam, the signal electron beam may be deflected by ExB deflector 200. When ExB deflector 200 is used to deflect the signal electron beam to be incident on a detecting area of second detector 194, second detector 194 may more efficiently detect the signal electron beam.

Example 4

Figure 13:
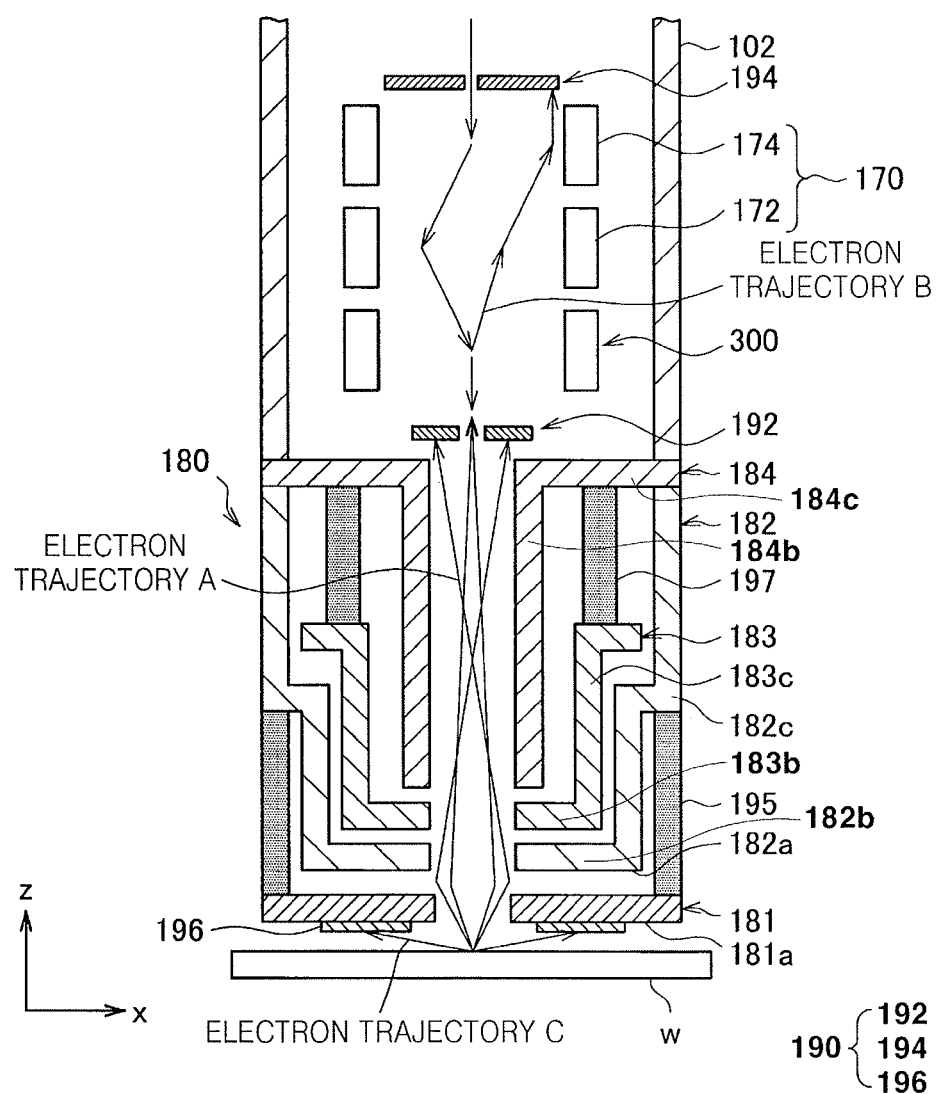
FIG. 13 illustrates an embodiment of electron beam column including a magnetic field-type alignment device.

As a alternative to improving the detecting efficiency of second detector 194, an alignment device 300 may be disposed above object lens 180 and first detector 192. The alignment device 300 may be a magnetic-field-type alignment device which operates as a deflection unit for deflecting an electron beam, as shown in FIG. 13. Although power sources that apply voltages to object lens 180 and electron detector 190 are not shown in FIG. 13, the same voltages as described above with reference to FIG. 3 may be applied thereto.

As shown in FIG. 13, scanning electrode 170 may be disposed above alignment device 300. In the current embodiment, a static alignment voltage may be added to a scan signal for forming an image on scanning electrode 170. In other words, scanning electrodes 172 and 174 that are disposed in two stages may operate as a part of the alignment device 300. The second detector 194 may be disposed above scanning electrode 170.

A primary electron beam may return to a central axis to pass through the opening of the first detector 192, by being reflected via a three-stage alignment formed by scanning electrodes 172 and 174 and alignment device 300. The primary electron beam that passed through the opening of the first detector 192 may be irradiated on wafer W on stage 18.

Heading directions of an electron beam reflected at wafer W and a signal electron beam including secondary electrons may be opposite to that of the primary electron beam. Thus, the signal electron beam that passed through the opening of the first detector 192 may be first deflected by alignment device 300 in a direction opposite to the primary electron beam, further deflected by the alignment voltage applied in an overlapping manner to scanning electrodes 172 and 174, and then incident on the second detector 194. By aligning the heading direction of the electron beam using scanning electrodes 172 and 174 and alignment device 300, the signal electron beam may be incident on the detecting area of second detector 194. As a result, second detector 194 may more efficiently detect the signal electron beam.

According to Example 3 of FIG. 12 and Example 4 of FIG. 13, an SEM image that has a selected detection angle may be obtained, as first detector 192 detects most of the signal electron beam and second detector 194 detects the signal electron beam at a small detection angle. Because the size of electron detector 190 is determined by the electron beam column 20 having a small size, such a configuration of obtaining an SEM image that has a selected detection angle is useful.

The arrangement of object lens 180 and electron detector 190, and the arrangement of a deflection unit for deflecting an electron beam such as ExB deflector 200 or alignment device 300, may be different in other embodiments.

By way of summation and review, an object lens of an electron beam column disposed close to a sample may include an electrostatic lens. A potential difference between a first voltage applied to a first electrode of the electrostatic lens closest to the sample and a sample voltage applied to the sample may affect electrification on a surface of the sample. An electron beam apparatus may efficiently measure an electrification state (e.g., surface electric potential) of the sample by detecting a secondary electron beam including secondary electrons or reflection electrons generated by the sample, while continuously changing the potential difference between the first voltage and the sample voltage.

When the electrostatic lens has three electrodes and the potential difference between the first voltage and sample voltage changes, a lens axis misalignment may occur due to a large change of a focus voltage, i.e., a voltage applied to a second electrode disposed above the first electrode of the electrostatic lens. As a result, an optical axis of an optical system of the electron beam column may need to be adjusted again, and it may be difficult to quickly change inspection conditions.

Also, when the potential difference between the first voltage and sample voltage continuously changes to measure an electric potential of the surface of the sample, the focus voltage may be largely misaligned and an irradiation spot diameter on the sample may be increased. As a result, a measurement area of the sample may be increased, thereby deteriorating a measurement precision.

Also, one detector that detects the secondary electron beam may be disposed above the electrostatic lens in the object lens. When an outer diameter of the electron beam column is reduced so as to dispose a plurality of the electron beam columns in the electron beam apparatus, a width or area of an electron detector disposed at each electron beam column is reduced. As a result, a range of an electron beam detectable by the electron detector may be limited.

More specifically, as shown in FIG. 15, the electron detector above the electrostatic lens in the object lens may be unable to detect a secondary electron beam that has a small detection angle (an angle formed by a heading direction of the secondary electron beam with respect to an incident direction of an electron beam) or a secondary electron beam that has a large detection angle and energy, due to a trajectory of the electron beam allowed by the electron beam column.

Accordingly, one or more embodiments provide an electron beam apparatus capable of improving an inspection precision by minimizing each of a plurality of electron beam columns included in the electron beam apparatus while improving a detecting performance on a defect of a sample.

In accordance with one or more of the aforementioned embodiments, a plurality of electron beam columns are included in an electron beam apparatus 1 and may be miniaturized. At the same time, detecting performance of a detect may be improved and become highly efficient.

In accordance with one or more of the aforementioned embodiments, an object lens 180 includes four electrodes. Accordingly, the amount of change of a third voltage (i.e., focus voltage) of a third electrode 183 may be reduced when the potential difference between the first voltage and a sample voltage changes. As a result, an electron beam column having low acceleration and high performance (e.g., low aberration) may be realized.

In accordance with one or more of the aforementioned embodiments, first through third detectors detect a secondary electron beam including secondary electrons or reflection electrons generated by the sample along the heading direction of the secondary electron beam As a result, an electron beam having a small detection angle or an electron beam having a large detection angle while having high energy may also be detected. Accordingly, an electron beam apparatus is provided which responds to the electrification state of the sample or to various detecting conditions according to types of detectors.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An electron beam apparatus, comprising:
at least one electron beam column including:
an electron beam optical system to irradiate an electron beam on a surface of a sample, and
a detection system to detect electrons generated according to irradiation of the electron beam, wherein the electron beam optical system includes an object lens to focus the electron beam at a predetermined location on a surface of the sample, and wherein the object lens includes an electrostatic lens that includes a first electrode to which a negative voltage is applied, a second electrode that is grounded, a third electrode to which a focus voltage is applied, and a fourth electrode that is grounded, the first through fourth electrodes sequentially arranged relative to the sample, wherein the first electrode of the object lens is closest to the sample among the first through fourth electrodes.

2. The apparatus as claimed in claim 1, wherein electrification on the surface of the sample, electron energy to be detected on the surface of the sample, an incident angle of the electron beam, or filtering of the electron beam is controlled based on changes in potential difference between a voltage applied to the first electrode and a voltage applied to the sample.

3. The apparatus as claimed in claim 1, wherein the focus voltage is a positive voltage.

4. The apparatus as claimed in claim 1, further comprising a plurality of the electron beam columns.

5. The apparatus as claimed in claim 1, wherein the detection system includes:
a first detector opposing the sample with respect to the object lens;
a second detector above the sample and spaced farther from the sample than the first detector; and
a third detector at the object lens.

6. The apparatus as claimed in claim 5, wherein the third detector is at the first electrode of the object lens.

7. The apparatus as claimed in claim 5, wherein:
the third detector is at the second electrode of the object lens, and
the first electrode includes an opening exposing the third detector.

8. An electron beam apparatus, comprising:
an electron beam column including:
an electron beam optical system to irradiate an electron beam on a surface of a sample, and
a detection system to detect electrons generated based on irradiation of the electron beam, wherein the electron beam optical system includes an object lens to focus the electron beam at a predetermined location on a surface of the sample, wherein the detection system includes a first detector and a second detector, and wherein the object lens is between the first detector and the sample and the first detector is between the object lens and the second detector.

9. The apparatus as claimed in claim 8, wherein an inner diameter of the second detector is less than an inner diameter of the first detector.

10. The apparatus as claimed in claim 8, further comprising:
a third detector at the object lens.

11. The apparatus as claimed in claim 10, wherein at least one of the first through third detectors includes a plurality of detecting units.

12. The apparatus as claimed in claim 8, wherein the object lens is an electrostatic lens which includes a first electrode to receive a negative voltage, a second electrode that is grounded, a third electrode to receive a focus voltage, and a fourth electrode that is grounded, and wherein the first electrode, second electrode, third electrode, and fourth electrode are sequentially arranged relative to the sample.

13. The apparatus as claimed in claim 8, wherein the electron beam column includes a deflection unit between the first and second detectors to deflect the electron beam.

14. The apparatus as claimed in claim 13, wherein the deflection unit includes an ExB deflector which includes an electric field that orthogonally crosses a magnetic field.

15. The apparatus as claimed in claim 13, wherein the deflection unit includes a magnetic-field type alignment device and a scanning electrode disposed above the magnetic field type alignment device.

16. An electron beam column, comprising:
an object lens to focus an electron beam on a surface of a sample, and
at least one detector to detect electrons based on the electron beam,
wherein the object lens includes an electrostatic lens that includes a first electrode to which a first voltage is applied, a second electrode that is grounded, a third electrode to which a second voltage is applied, and a fourth electrode that is grounded, wherein the first through fourth electrodes are sequentially arranged relative to the sample, and wherein the first electrode of the object lens is closest to the sample among the first through fourth electrodes.

17. The electron beam column as claimed in claim 16, wherein:
the first voltage is one of a negative voltage or positive voltage, and
the second voltage is the other one of the negative voltage and the positive voltage.

18. The electron beam column as claimed in claim 16, wherein the at least one detector includes a plurality of detectors aligned along a common axis passing through the object lens.

19. The electron beam column as claimed in claim 18, wherein the plurality of detectors includes:
   a first detector spaced a first distance from the sample;
   a second detector spaced a second distance from the sample; and
   a third detector spaced a third distance from the sample.

20. The electron beam column as claimed in claim 19, wherein:
   the second distance is greater than the first distance, and
   the third distance is less than the first and second distances.

* * * * *